(12) United States Patent
Tatsumura et al.

(10) Patent No.: US 9,646,686 B2
(45) Date of Patent: May 9, 2017

(54) RECONFIGURABLE CIRCUIT INCLUDING ROW ADDRESS REPLACEMENT CIRCUIT FOR REPLACING DEFECTIVE ADDRESS

(71) Applicant: KABUSHIKI KAISHA TOSHIBA, Tokyo (JP)

(72) Inventors: Kosuke Tatsumura, Kanagawa (JP); Koichiro Zaitsu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/056,083

(22) Filed: Feb. 29, 2016

(65) Prior Publication Data
US 2016/0276025 A1   Sep. 22, 2016

(30) Foreign Application Priority Data

Mar. 20, 2015 (JP) .................. 2015-058122

(51) Int. Cl.
G11C 11/00 (2006.01)
G11C 13/00 (2006.01)
G11C 29/00 (2006.01)

(52) U.S. Cl.
CPC ........ G11C 13/0028 (2013.01); G11C 29/808 (2013.01); G11C 29/785 (2013.01)

(58) Field of Classification Search
CPC ....... G11C 29/808; G11C 29/785; G11C 8/08; G11C 13/0004; G11C 29/838; G11C 29/02

(Continued)

(56) References Cited

U.S. PATENT DOCUMENTS 6,021,490 A    2/2000   Vorbach et al.
6,480,937 B1   11/2002  Vorbach et al.
(Continued)

FOREIGN PATENT DOCUMENTS

JP   2004-535613   11/2004
JP   2005-101535   4/2005
(Continued)

OTHER PUBLICATIONS

Miyamura et al.: "Programmable Cell Array Using Rewritable Solid-Electrolyte Switch Integrated in 9nm CMOS", ISSCC 2001/ Session 12/Design in Emerging Technologies/12.7, 2011 IEEE International Solid-State Circuits Conference, pp. 228-229, (2011).

(Continued)

*Primary Examiner* — David Lam
(74) *Attorney, Agent, or Firm* — Finnegan, Henderson, Farabow, Garrett & Dunner, LLP

(57) ABSTRACT

According to one embodiment, a reconfigurable circuit includes circuit blocks arranged with a matrix of A rows and B columns. Each of the circuit blocks includes M row conductive lines, N column conductive lines crossing the row conductive lines, output inverters each having input and output terminals, the input terminal of each output inverter connected to corresponding one of the row conductive lines, input inverters each having input and output terminals, the output terminal of each input inverter connected to corresponding one of the column conductive lines, and resistance change elements between the row conductive lines and the column conductive lines, each of the resistance change elements including a first terminal and a second terminal, the first terminal being connected to corresponding one of the row conductive lines, the second terminal being connected to corresponding one of the column conductive lines.

20 Claims, 11 Drawing Sheets

(58) Field of Classification Search
USPC .......................... 365/148, 200, 201, 230.03
See application file for complete search history.

(56) References Cited

U.S. PATENT DOCUMENTS

| | | | |
|---|---|---|---|
| 6,571,381 | B1 | 5/2003 | Vorbach et al. |
| 7,444,531 | B2 | 10/2008 | Vorbach et al. |
| 7,486,549 | B2 * | 2/2009 | Hidaka .................. G11C 11/16 365/158 |
| 8,254,192 | B2 * | 8/2012 | Tsuchida .................. G11C 8/08 365/148 |
| 8,301,872 | B2 | 10/2012 | Vorbach et al. |
| 8,429,385 | B2 | 4/2013 | Vorbach |
| 8,686,475 | B2 | 4/2014 | Vorbach |
| 2003/0046607 | A1 | 3/2003 | May et al. |
| 2003/0056202 | A1 | 3/2003 | May et al. |
| 2004/0015899 | A1 | 1/2004 | May et al. |
| 2004/0025005 | A1 | 2/2004 | Vorbach et al. |
| 2004/0128474 | A1 | 7/2004 | Vorbach |
| 2004/0243984 | A1 | 12/2004 | Vorbach et al. |
| 2004/0249880 | A1 | 12/2004 | Vorbach |
| 2005/0045919 | A1 | 3/2005 | Kaeriyama et al. |
| 2005/0053056 | A1 | 3/2005 | Vorbach et al. |
| 2005/0066213 | A1 | 3/2005 | Vorbach et al. |
| 2005/0086462 | A1 | 4/2005 | Vorbach |
| 2005/0086649 | A1 | 4/2005 | Vorbach et al. |
| 2005/0132344 | A1 | 6/2005 | Vorbach et al. |
| 2005/0223212 | A1 | 10/2005 | Vorbach et al. |
| 2006/0075211 | A1 | 4/2006 | Vorbach |
| 2006/0090062 | A1 | 4/2006 | Vorbach et al. |
| 2006/0192586 | A1 | 8/2006 | Vorbach |
| 2006/0245225 | A1 | 11/2006 | Vorbach |
| 2006/0248317 | A1 | 11/2006 | Vorbach et al. |
| 2007/0011433 | A1 | 1/2007 | Vorbach |
| 2007/0050603 | A1 | 3/2007 | Vorbach et al. |
| 2007/0083730 | A1 | 4/2007 | Vorbach et al. |
| 2007/0113046 | A1 | 5/2007 | Vorbach et al. |
| 2007/0150637 | A1 | 6/2007 | Vorbach |
| 2007/0299993 | A1 | 12/2007 | Vorbach et al. |
| 2009/0031104 | A1 | 1/2009 | Vorbach et al. |
| 2009/0144522 | A1 | 6/2009 | Vorbach et al. |
| 2011/0145547 | A1 | 6/2011 | Vorbach |
| 2011/0238948 | A1 | 9/2011 | Vorbach et al. |
| 2012/0011281 | A1 | 1/2012 | Hamada et al. |
| 2013/0111188 | A9 | 5/2013 | Vorbach et al. |
| 2014/0310466 | A1 | 10/2014 | Vorbach et al. |
| 2015/0106596 | A1 | 4/2015 | Vorbach et al. |

FOREIGN PATENT DOCUMENTS

| | | |
|---|---|---|
| JP | 2005-515525 | 5/2005 |
| JP | 2012-18525 | 1/2012 |
| JP | 2015-18590 | 1/2015 |
| WO | WO 02/071248 | 9/2002 |
| WO | WO 03/036507 | 5/2003 |

OTHER PUBLICATIONS

Miyamura et al.; "First Demonstration of Logic Mapping on Non-volatile Programmable Cell Using Complementary Atom Switch", IEEE, pp. 10.6.1 to 10.6.4, (2012).

Tada et al.; "Nonvolatile Crossbar Switch Using $TiO_x$/ $TaSiO_y$ Solid Electrolyte", IEEE Transactions on Electron Devices, vol. 57, No. 8, pp. 1987-1995, (2010).

English-language abstract of WO 99/44120, Vorbach et al., "Method for Configuring Data Flow Processors and Modules With a Two- or Multidimensional Programmable Cell Structure (FFGAs, DPGAs or Similar) Without Producing Deadlocks", Sep. 2, 1999.

English-language abstract of WO 99/44147, Vorbach et al., "Method for Cacheing Configuration Data of Data Flow Processors and Modules With a Two-or Multidimensional Programmable Cell Structure (FFGAs, DPGAs or Similar) According to a Hierarchy", Sep. 2, 1999.

* cited by examiner

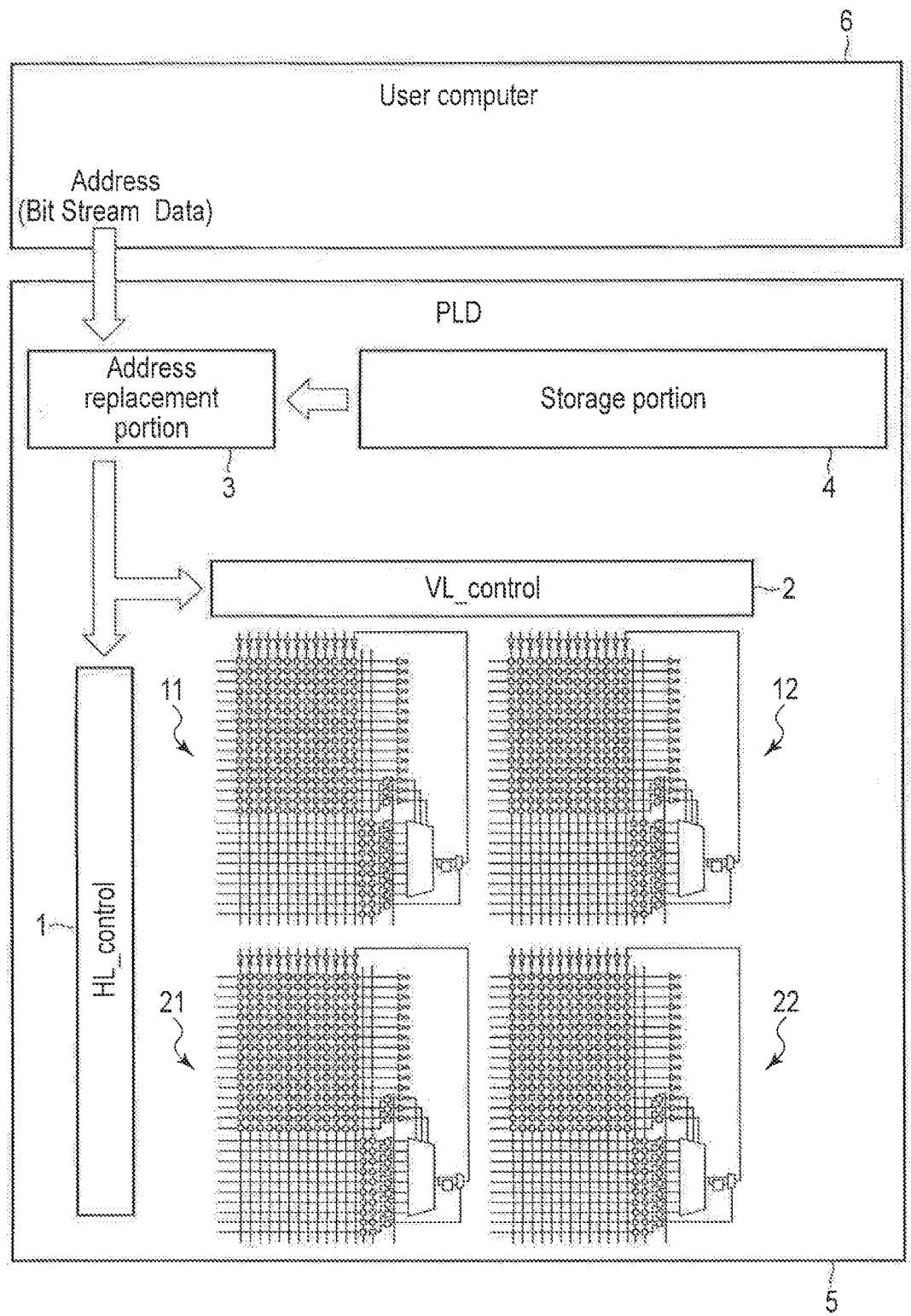
F I G. 10

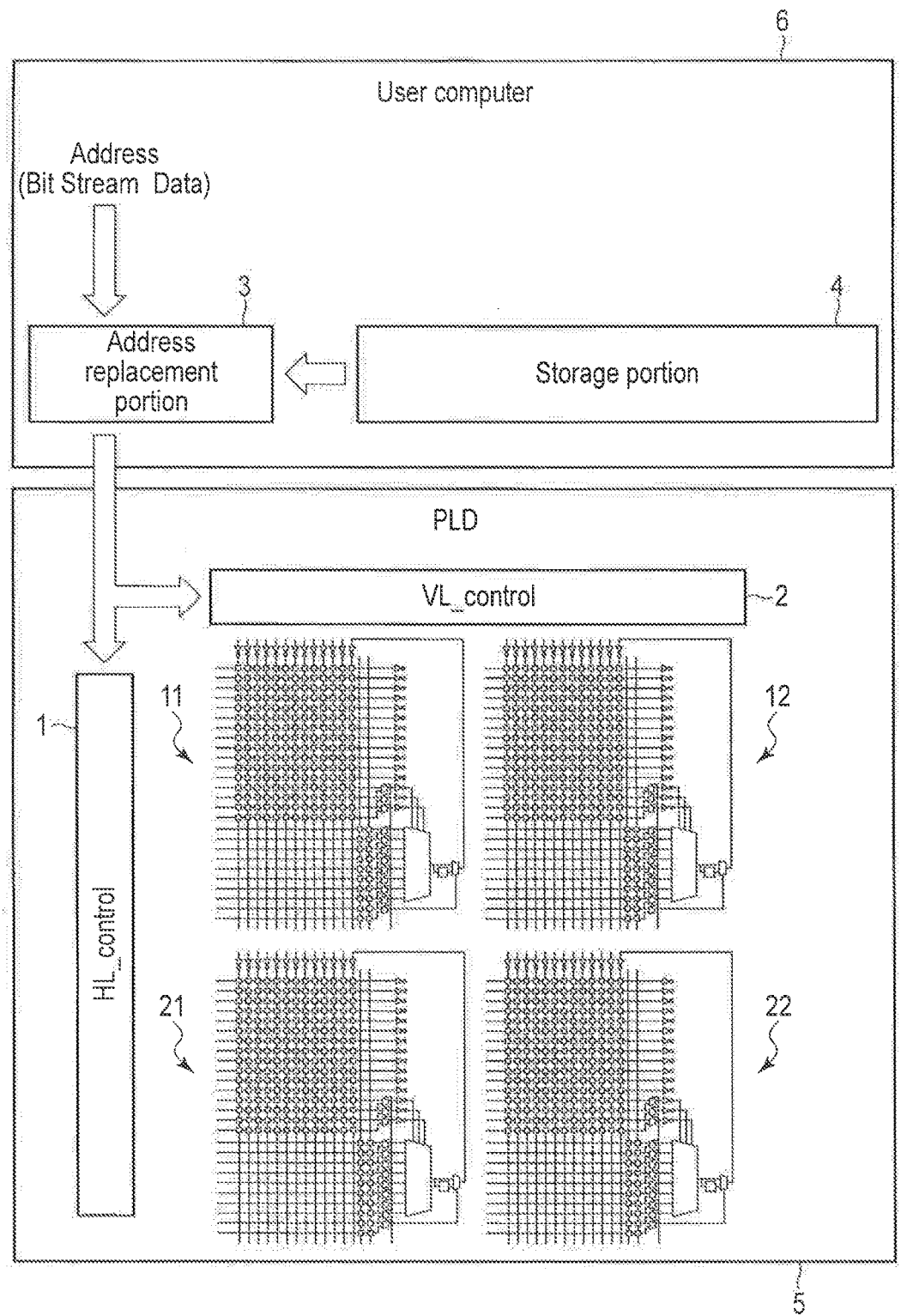
F I G. 11

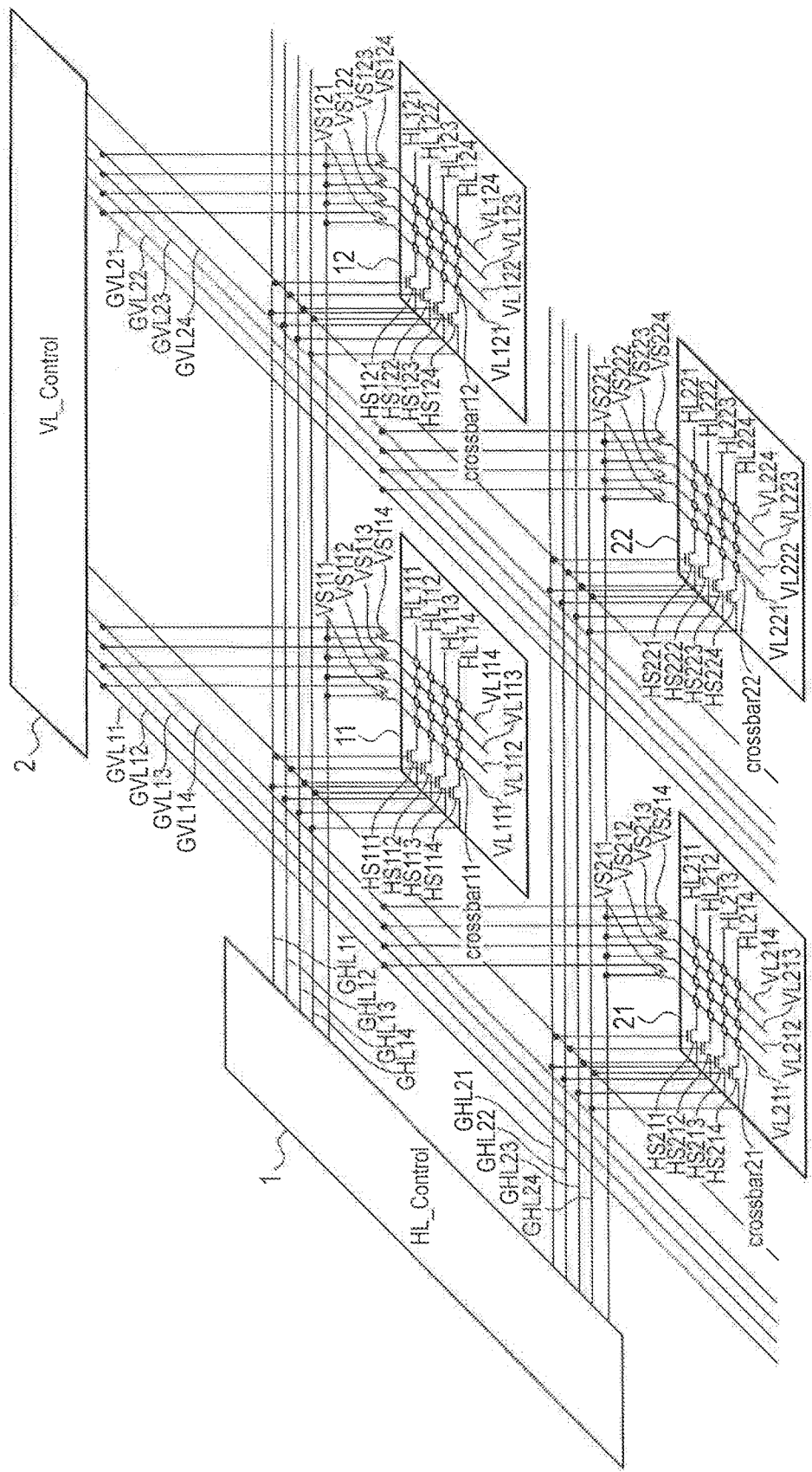
F I G. 12

RECONFIGURABLE CIRCUIT INCLUDING ROW ADDRESS REPLACEMENT CIRCUIT FOR REPLACING DEFECTIVE ADDRESS

CROSS-REFERENCE TO RELATED APPLICATIONS

This application is based upon and claims the benefit of priority from Japanese Patent Application No. 2015-058122, filed Mar. 20, 2015, the entire contents of which are incorporated herein by reference.

FIELD

Embodiments described herein relate generally to a reconfigurable circuit.

BACKGROUND

A programmable logic device (PLD) represented by a field-programmable gate array (FPGA) is a semiconductor integrated circuit which can make a change in a circuit configuration after chip fabrication. An island-style PLD includes a two-dimensional repetitive structure of computational units. A computational unit comprises programmable wiring resources and programmable logic resources.

The programmable wiring resources include a programmable crossbar which comprises a group of conductive lines, another group of conductive lines which intersect perpendicularly with the former group of conductive lines, switches which change the interconnected relation between the former group of conductive lines and the latter group of conductive lines, and a memory which records the interconnected relation. The programmable crossbar may be called a "Programmable Interconnect" or a "Programmable Switch Matrix."

There is known a technology which constitutes a programmable crossbar from a group of conductive lines, another group of conductive lines which intersect perpendicularly with the former group of conductive lines, a group of resistance change elements at respective intersections where the former group of conductive lines intersect perpendicularly with the latter group of conductive lines. Any resistance change element is, for example, a nonvolatile resistance change element having two terminals, and an application of a predetermined voltage across the terminals causes the element to change its state between a low-resistance state and a high-resistance state. A programmable crossbar which uses two-terminal nonvolatile resistance change elements is small in area and high in routability. Therefore, the introduction of a programmable crossbar which uses two-terminal nonvolatile resistance change elements allows a PLD to have increased logic density.

There is a demand for a fault-tolerant technique which is applicable to a programmable crossbar using two-terminal nonvolatile resistance change elements. The fault-tolerant technique is a technique of avoiding an adverse effect and causing a system to normally function as a whole even if one or some of the resistance change elements may be defective. The fault-tolerant technique will be implemented by applying a certain redundancy, that is, by adding an area overhead. In order to allow any PLD to have an increased logic density, the fault-tolerant technique with few area overheads is searched for.

BRIEF DESCRIPTION OF THE DRAWINGS

FIG. 10 is a view illustrating an exemplary PLD having an address replacement portion.

FIG. 11 is a view illustrating an exemplary user computer having an address replacement portion.

FIG. 12 is a view illustrating an exemplary application of the PLD including programmable crossbars and a program control circuit.

DETAILED DESCRIPTION

In general, according to one embodiment, a reconfigurable circuit comprises: circuit blocks arranged with a matrix of A rows and B columns. Each of the circuit blocks comprises: M row conductive lines; N column conductive lines crossing the row conductive lines; output inverters each having input and output terminals, the input terminal of each output inverter connected to corresponding one of the row conductive lines; input inverters each having input and output terminals, the output terminal of each input inverter connected to corresponding one of the column conductive lines; and resistance change elements between the row conductive lines and the column conductive lines, each of the resistance change elements including a first terminal and a second terminal, the first terminal being connected to corresponding one of the row conductive lines, the second terminal being connected to corresponding one of the column conductive lines, the resistance change element between the $m^{th}$-row conductive line and the $n^{th}$-column conductive line in the circuit block located at the $a^{th}$-row and the $b^{th}$-column being selected by an address abmn ($1 \le a \le A$, $1 \le b \le B$, $1 \le m \le M$, $1 \le n \le N$). The reconfigurable circuit further comprises: an interconnection connected between the output terminal of the output inverter connected to the row conductive line in one of the circuit blocks and the input terminal of the input inverter connected to the column conductive line in the other one of the circuit blocks; and a row address replacement circuit for replacing address $a^D b^D m^D \forall$ with address $a^D b^D m^S \forall$ and a column address replacement circuit for replacing address $a^O b^O \forall q^D$ with address $a^O b^O \forall n^S$, wherein $\forall$ stands for an arbitrary number, on condition that the resistance change element selected by address $a^D b^D m^D n^D$ is defective, that the output terminal of the output inverter connected to the $m^{Dth}$-row conductive line in the circuit block located at the $a^{Dth}$-row and the $b^{Dth}$-column is connected to the input terminal of the input inverter connected to the $q^{Dth}$-column conductive line in the circuit block located at the $a^{Oth}$-row and the $b^{Oth}$-column, and that the output terminal of the output inverter connected to the $m^{Sth}$-row conductive line in the circuit block located at the $a^{Dth}$-row and the $b^{Dth}$-column is connected to the input terminal of the input inverter connected to the $n^{Sth}$-column conductive line in the circuit block located at the $a^{Oth}$-row and the $b^{Oth}$-column.

Hereafter, embodiments will be described with making reference to the drawings.

1. Embodiments

Figure 1:
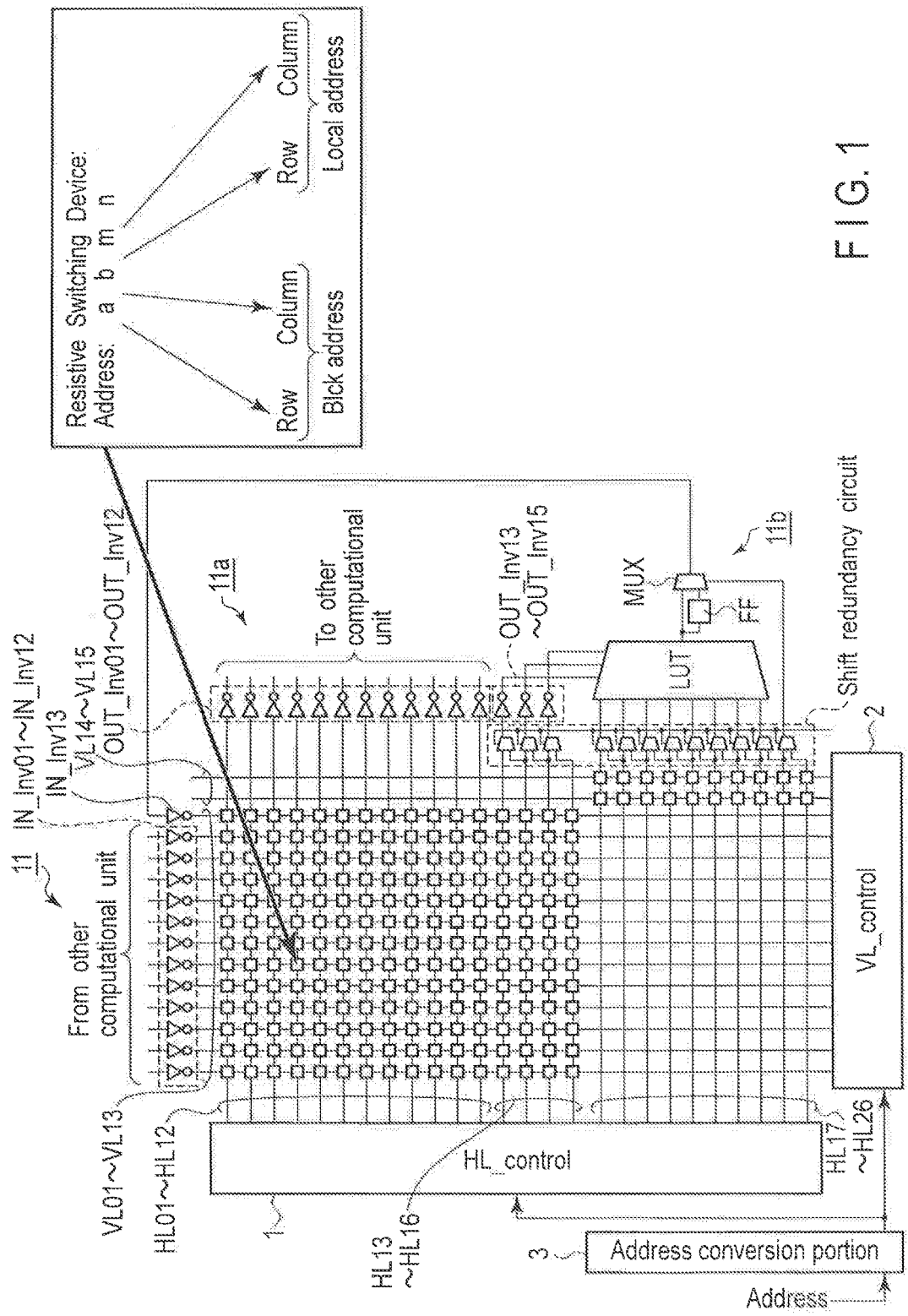
FIG. 1 is a view illustrating an exemplary programmable computational unit.

FIG. 1 illustrates a programmable computational unit including a programmable crossbar which uses two-terminal nonvolatile resistance change elements.

A programmable computational unit 11 includes a programmable crossbar 11a (sometimes referred to as a "circuit block" in the present specification) and a programmable logic 11b.

The programmable crossbar 11a comprises a row conductive line group which comprises M row conductive lines (for example, M=16) HL01-HL16, a column conductive line group which comprises N column conductive lines (for example, N=13) VL01-VL13 perpendicularly intersecting the M row conductive lines HL01-HL16, output-inverters OUT_Inv01-OUT_Inv15 each having an input terminal connected to the corresponding one of the M row conductive lines HL01-HL16, and input-inverters IN_Inv01-IN_Inv13 each having an output terminal connected to corresponding one of the N column conductive lines.

Input signals are input from another programmable computational unit to the input terminals of the input inverters IN_Inv01-IN_Inv12. Moreover, output signals are output from the output terminals of the output-inverters OUT_Inv01-IN_Inv12 to still another programmable computational unit.

Resistance change elements are arranged in the respective intersections where the M row conductive lines HL01-HL16 cross perpendicularly the N column conductive lines VL01-VL13. Each resistance change element has a first terminal connected to one row conductive line included in the row conductive line group and a second terminal connected to one column conductive line included in the column conductive line group, and changes its state from either one of a low-resistance state and a high-resistance state to the other resistance state by application of a voltage between the first terminal and the second terminal.

The programmable crossbar 11a has a function of a multi-input multi-output multiplexer, so that an input signal having been input into any one input inverter can be output from an arbitrary output inverter.

The programmable logic 11b has a K-input single-output look-up table LUT (K=3 in the present embodiment), a flip-flop FF for constituting a sequential circuit, and a double-input single-output multiplexer MUX.

The look-up table LUT can implement a k-input single-output arbitrary truth table. The multiplexer MUX chooses and outputs one of an output of the look-up table LUT and an output of the flip-flop FF.

The programmable logic 11b receives three input signals from the programmable crossbar 11a, and outputs one output signal. The one output signal is input into the thirteenth input terminal of the input inverters IN_Inv13 in the programmable crossbar 11a.

The programmable logic 11b further has, as a configuration memory of the look-up table LUT and the multiplexer MUX, two or more (10 in the present embodiment) row conductive lines HL17-HL26, two or more (2 in the present embodiment) column conductive lines VL14-VL15, and two or more resistance change elements arranged in the respective intersections, where the row conductive lines HL17-HL26 and the column conductive lines VL14-VL15 cross. Each resistance change element is a two-terminal resistance change element in the same way as each resistance change element in the programmable crossbar 11a.

Concerning two or more resistance change elements in the programmable logic 11b, one of any two resistance change elements, both connected to one and the same row conductive line, is set in a low-resistance state and the other is set in a high-resistance state. To achieve this, the power supply potential VDD is applied to one of the two column conductive lines VL14 and VL15, and the earth potential VSS is applied to the other of the two row conductive lines VL14 and VL15, for example. Then, the aforementioned one of the two resistance change elements, both connected to the aforementioned one single row conductive line, will be set to have one of the power supply potential VDD and ground potential VSS, whereas the other will be set to have the other of the power supply potential VDD and the earth potential VSS. In this way, one will be set in a low-resistance state and the other is set in a high-resistance state.

The programmable computational unit 11 in the embodiment has a shift redundancy circuit.

For example, the programmable crossbar 11a has four row conductive lines HL13-HL16. Three of the four row conductive lines HL13-HL16 are connected to the input terminals of the look-up table LUT, and the remaining one is used as a spare row conductive line.

Moreover, the programmable logic 11b has ten row conductive lines HL17-HL26. Nine of the ten row conductive lines HL17-HL26 are connected to the look-up table LUT and the multiplexer MUX as output terminals of a configuration memory, and the remaining one is used as a spare row conductive line.

Such a shift redundancy circuit makes it possible to maintain a normal function even if one of the three row conductive lines HL13-HL15 becomes defective. This is because the shift redundancy circuit makes it possible to use the spare row conductive line HL16 in place of the defective one of the row conductive lines HL13-HL15. Similarly, a normal function can be maintained even if one of the nine row conductive lines HL17-HL25 becomes defective, because the spare row conductive line HL26 can be used in place of the defective one of the row conductive lines HL17-HL25.

After all, the programmable computational unit of the present embodiment has a total of 26 row conductive lines HL01-HL26 and a total of 15 column conductive lines VL01-VL5.

Now, let us consider a programmable logic device having a matrix with A rows and B columns. The programmable logic device has a plurality of programmable computational units. Each programmable computational unit has a matrix with M rows and N columns and is located at an intersection specified by an $a^{th}$ row and a $b^{th}$ column of the programmable logic device. Each programmable computational unit has intersections, where m row conductive lines and n column conductive lines cross, and a plurality of resistance change elements. Each resistance change element is located at any one intersection where the $m^{th}$ row conductive line and the $n^{th}$ column conductive line cross each other. Therefore, the address of each and every resistance change element may be expressed as abmn ($1 \leq a \leq A$, $1 \leq b \leq B$, $1 \leq m \leq M$, $1 \leq n \leq N$).

Here, a, b, m, and n are bit strings indicating a row address of a crossbar array (a block row address), a column address of the crossbar array (a block column address), the row address within the crossbar array (a local row address), and the column address within the crossbar array (a local column address). In the present embodiment, the full address of "abmn" is expressed by a concatenation of bit strings of a, b, m, and n.

At the time of writing data to two or more resistance change elements, a row driver (HL_control) 1 and a column driver (VL_control) 2 select from two or more programmable computational units a programmable computational unit specified by the block row address a and the block column address b. Moreover, the row driver (HL_control) 1 and the column driver (VL_control) 2 select a resistance change element specified by the local row address m and the local column address n from the two or more resistance change elements in the selected programmable computational unit.

The address replacement portion (address transition portion: ATP) 3 replaces an externally input address with an address which specifies a spare row or a spare column, when the address externally input (from a user computer, for example) specifies a defective row or a defective column, including a defective cell. The address after replacement is transmitted to the row driver (HL_control) 1 and the column driver (VL_control) 2, and these drivers (HL_control, VL_control) 1 and 2 select a resistance change element based on the address after replacement.

Figure 2:
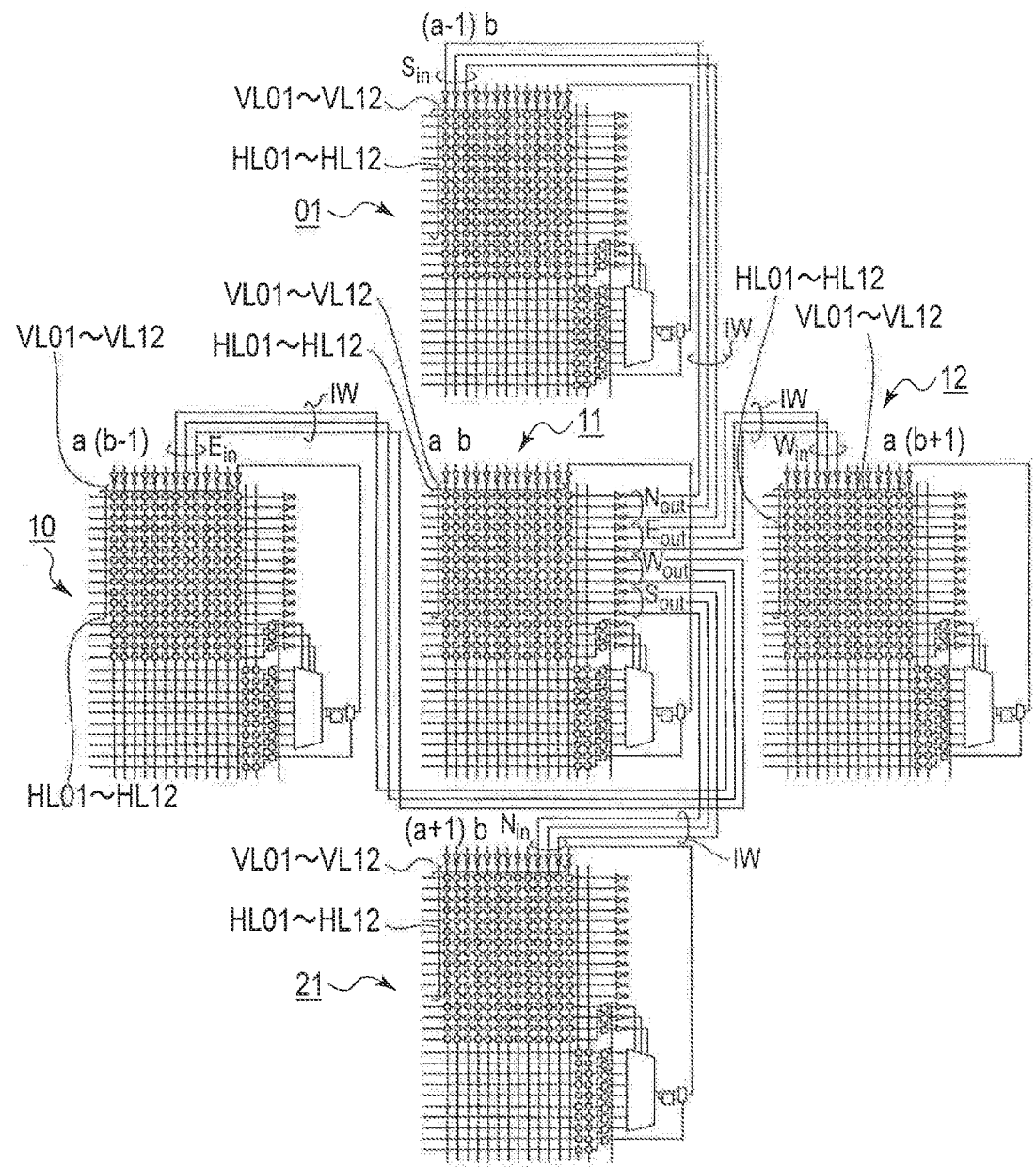
FIG. 2 is a view illustrating an example of how programmable computational units are interconnected.

FIG. 2 illustrates how programmable computational units are arranged and interconnected.

Each of the computational units 01, 10, 11, 12, and 21 has twelve input terminals and twelve output terminals. The computational units are mutually connected through conductive lines (IW) in such a manner that some input terminals of one computational unit are connected with some output terminals of another computational unit. In the present embodiment, horizontally or vertically adjacent two of the five computational units are interconnected.

A computational unit 11 at a row a and a column b has a first output terminal to a third output terminal ($N_{out}$). A computational unit 01 at a row a−1 and the column b corresponding to a north position with respect to the computational unit 11 has a first input terminal to a third input terminal ($S_{in}$). The first to third output terminals ($N_{out}$) of the computational unit 11 are respectively connected to the first to third input terminals ($S_{in}$) of the computational unit 01.

The computational unit 11 at the row a and the column b has a fourth output terminal to a sixth output terminal ($E_{out}$). A computational unit 12 at the row a and a column b+1 corresponding to an east position with respect to the computational unit 11 has a fourth input terminal to a sixth input terminal ($W_{in}$). The fourth to sixth output terminals ($E_{out}$) of the computational unit 11 are respectively connected to the fourth to sixth input terminals ($W_{in}$) of the computational unit 12.

The computational unit 11 at the row a and the column b has a seventh output terminal to a ninth output terminal ($W_{out}$). A computational unit 10 at the row a and a column b−1 corresponding to a west position with respect to the computational unit 11 has a seventh input terminal to a ninth input terminal ($E_{in}$). The seventh to ninth output terminals ($W_{out}$) of the computational unit 11 are respectively connected to the seventh to ninth input terminals ($E_{in}$) of the computational unit 10.

The computational unit 11 at the row a and the column b has a tenth output terminal to a twelfth output terminal ($S_{out}$). A computational unit 21 at a row a+1 and the column b corresponding to a south position with respect to the computational unit 11 has a tenth input terminal to a twelfth input terminal ($N_{in}$). The tenth to twelfth output terminals ($S_{out}$) of the computational unit 11 are respectively connected to the tenth to twelfth input terminals ($N_{in}$) of the computational unit 21.

In this way, in the present embodiment, the output terminal of an output inverter connected to the $k^{th}$ row conductive line of one crossbar is connected to the input terminal of an input inverter connected to the $k^{th}$ column conductive line of another crossbar. That is, a row conductive line and a column conductive line are mutually connected by connection of an input inverter and an output inverter. Therefore, the local row address of the row conductive line and the local column address of the column conductive line will be in agreement with each other.

Figure 3:
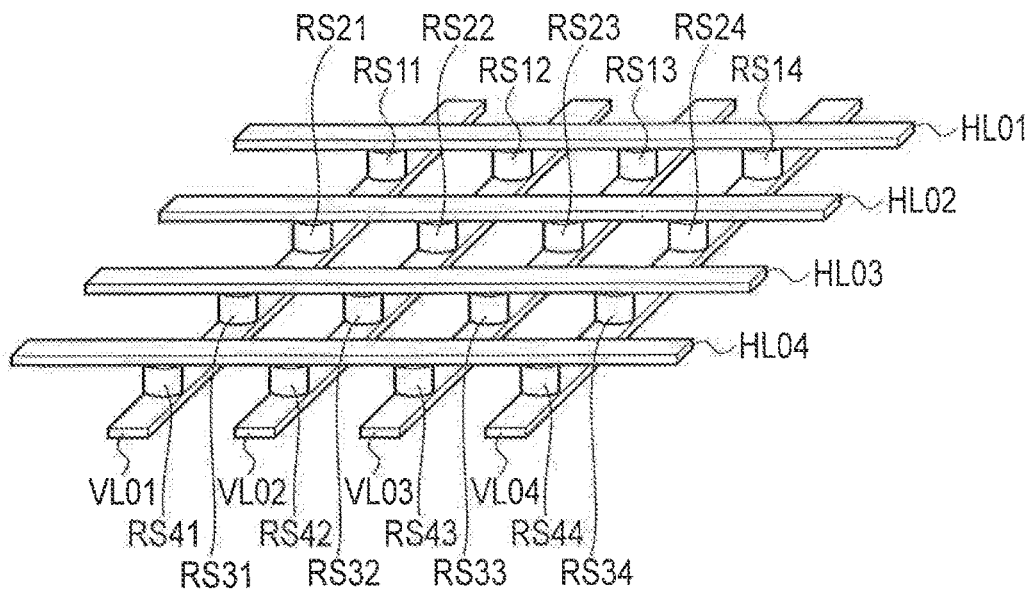
FIG. 3 is a view illustrating an exemplary programmable crossbar.
Figure 4:
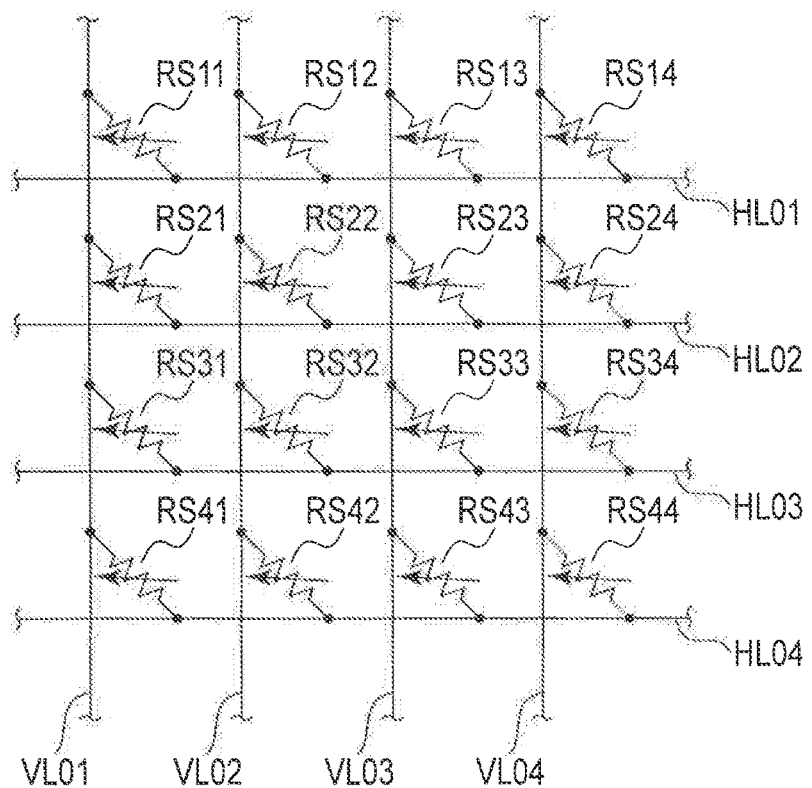
FIG. 4 is a view illustrating an equal circuit of FIG. 3.

FIG. 3 illustrates an exemplary programmable crossbar which has resistance change elements between two interconnection layers. FIG. 4 illustrates an equivalent circuit of the programmable crossbar of FIG. 3.

The programmable crossbar of this example has a size of 4×4, and comprises a row conductive line group including four row conductive lines HL01, HL02, HL03 and HL04, and a column conductive line group including four column conductive lines VL01, VL02, VL03, and VL04. A total of 16 resistance change elements RS11-RS14, RS21-RS24, RS31-RS34, and RS41-RS44 are provided in the respective intersections of the row conductive line group and the column conductive line group. For example, one row conductive line HL01 has resistance change elements RS11, RS12, RS13 and RS14 at respective intersections where the row conductive line HL01 crosses four column conductive lines VL01, VL02, VL03, and VL04.

Figure 5:
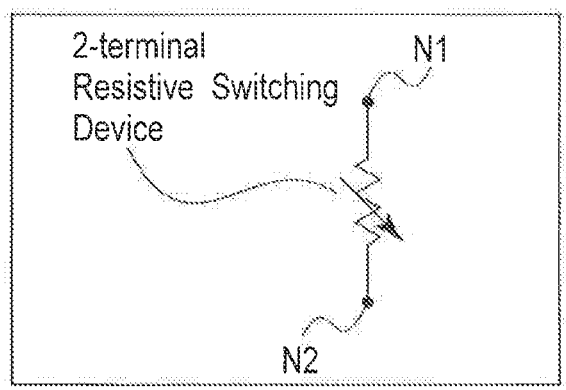
FIG. 5 is a view illustrating an exemplary resistance change element.

FIG. 5 illustrates an exemplary resistance change element.

A resistance change element may be a mono-polar type controllably brought into either a high-resistance state or a low-resistance state by a voltage with the same polarity, and may be a bipolar type controllably brought into either a high-resistance state or a low-resistance state by a voltage with reversed polarity.

For example, a resistance change element in a high-resistance state (HRS) is determined to be in a reset state, whereas the resistance change element in a low-resistance state (LRS) is determined to be in a set state.

When a resistance change element is brought in an HRS, the resistance between N1 and N2 will be high. Therefore, the resistance change element prevents a signal from traveling between the conductive lines which are connected by the resistance change element. The resistance change element in the HRS will be brought in an LRS upon application of a voltage pulse greater than a setting voltage $V_{set}$. This is called a setting operation.

When the resistance change element is brought in the LRS, the resistance between N1 and N2 will be low. Therefore, the resistance change element allows a signal to travel between the conductive lines which are connected by the resistance change element. The resistance change element in the LRS will be brought in an HRS upon application of a voltage pulse greater than a reset voltage $V_{rst}$. This is called a reset operation.

Figure 6:
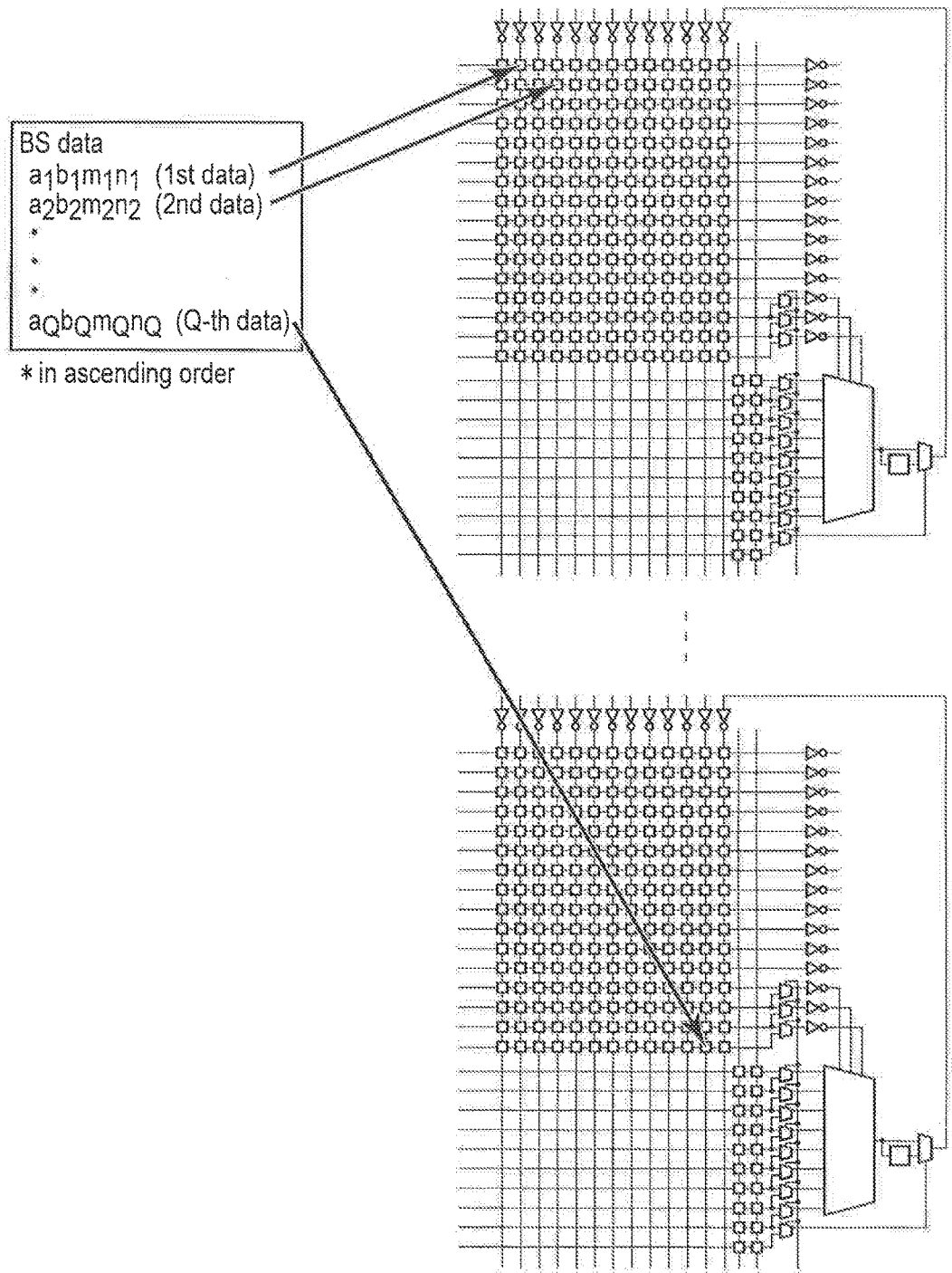
FIG. 6 is a view explaining bitstream data.

FIG. 6 is a view explaining bitstream (BS) data or the circuit configuration data for arranging programmable computational units.

The circuit configuration data includes an address list of resistance change elements which should be brought in a low-resistance state (a circuit configuration data table).

In the present embodiment, the number of addresses included in the circuit configuration data is Q, and the addresses are arranged in a bit ascending order. The writing of circuit configuration data is carried out in this order. Let us assume that all the resistance change elements are in a high-resistance state (all in a reset state) before any circuit configuration data is written.

Figure 7:
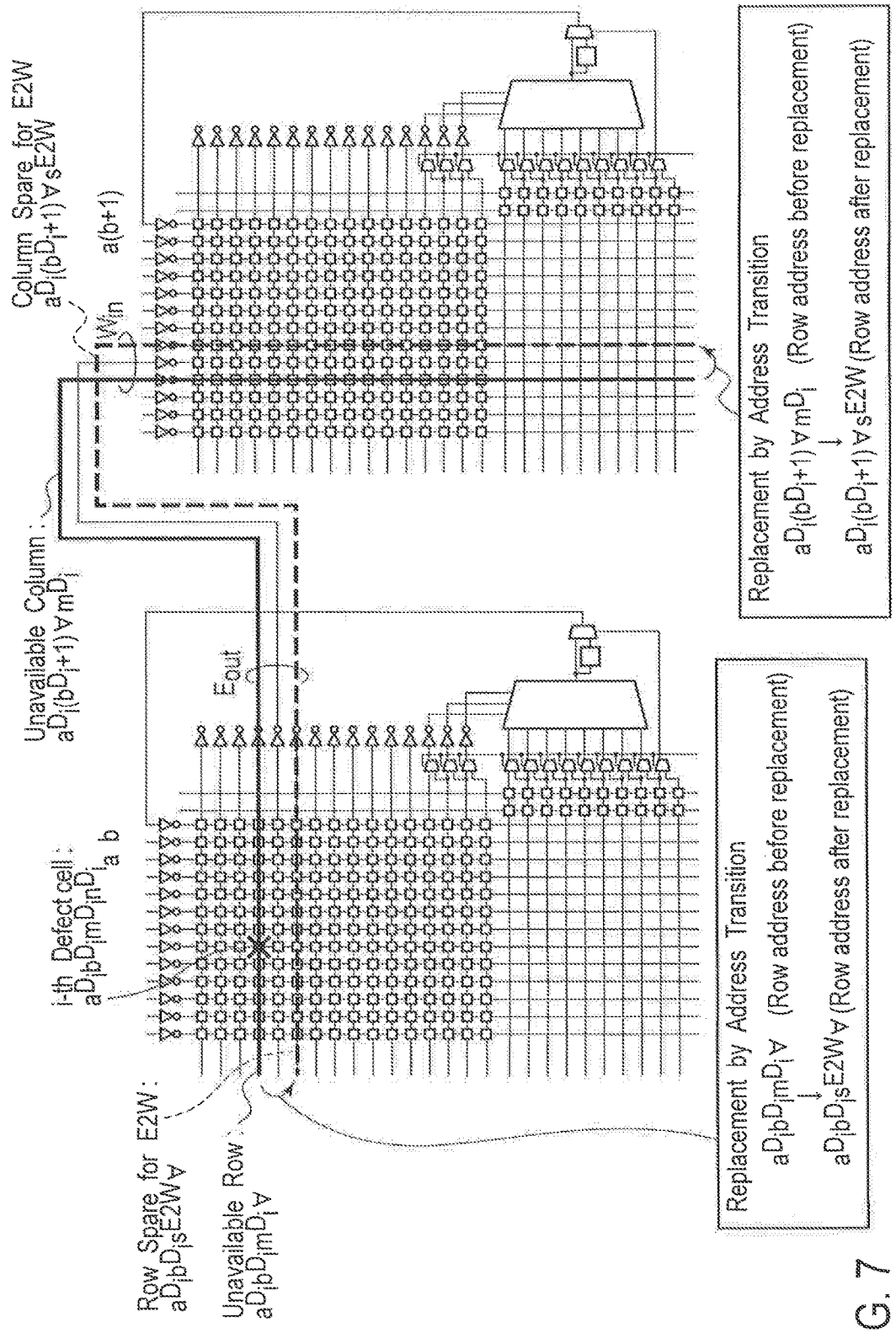
FIG. 7 is a view illustrating an exemplary method of relieving a defective cell by address replacement.

FIG. 7 illustrates a method of coping with any defect by address replacement.

Let us assume that there are P defects in the array of programmable computational units, and that an $i^{th}$ defect is represented by an address of $a^D_i b^D_i m^D_i n^D_i$.

A defective row conductive line in a defective computational unit is unavailable. A column conductive line to which the defective row conductive line is connected by an input inverter and an output inverter is also unavailable.

In the embodiment of FIG. 7, the row conductive line specified by $a^D_i b^D_i m^D_i \forall$ is unavailable, wherein $\forall$ stands for an arbitrary number or a don't-care bit string. Furthermore, the column conductive line specified by $a^D_i (b^D_i+1) \forall m^D_i$ to which the unavailable row conductive line is connected is also unavailable. It should be noted that, in the present embodiment, a local row address of an unavailable row conductive line coincides with a local column address of an unavailable column conductive line.

When a computational unit, in which a defect exists and has a defective row conductive line, has a spare row conductive line, and another computational unit, which has a column conductive line connected to the defective row conductive line of the defective computational unit, has a spare column conductive line connected to the spare row conductive line of the defective computational unit through its own spare input inverter and a spare output inverter of the defective computational unit, the defect may be coped with by using the spare row conductive line and the spare column conductive line in place of the unavailable row conductive line of the defective computational unit and its own unavailable column conductive line.

In the embodiment of FIG. 7, an a row b column computational unit in which a defect exists and an a row b+1 column computational unit to which the defective row conductive line is connected respectively have a spare row conductive line specified by $a^D_i b^D_i s^{E2W} \forall$ and a spare column conductive line specified by $a^D_i (b^D_i+1) \forall s^{E2W}$, both conductive lines being connected with each other.

At the time of writing circuit configuration data, the writing of data may be executed after carrying out a row address replacement which replaces $a^D_i b^D_i m^D_i \forall$ with $a^D_i b^D_i s^{E2W} \forall$ and a column address replacement which replaces $a^D_i (b^D_i+1) \forall m^D_i$ with $a^D_i (b^D_i+1) \forall s^{E2W}$. This will surely avoid any malfunction caused by the defect of the cell specified by $a^D_i b^D_i m^D_i n^D_i$.

In the present embodiment, the hardware resources which are needed in order to avoid a defect are a spare row conductive line, a spare column conductive line, two-terminal nonvolatile resistance change memories connected to the respective conductive lines, an input inverter connected to the spare column conductive line and an output inverter connected to the spare row conductive line. A spare row conductive line, a spare column conductive line, and resistance change memories are all formed in an interconnection layer in the best case. As a result, a silicon area will be unnecessary. In the present embodiment, therefore, a silicon area can be made small in comparison with a case where a shift redundancy method is used.

Figure 8:
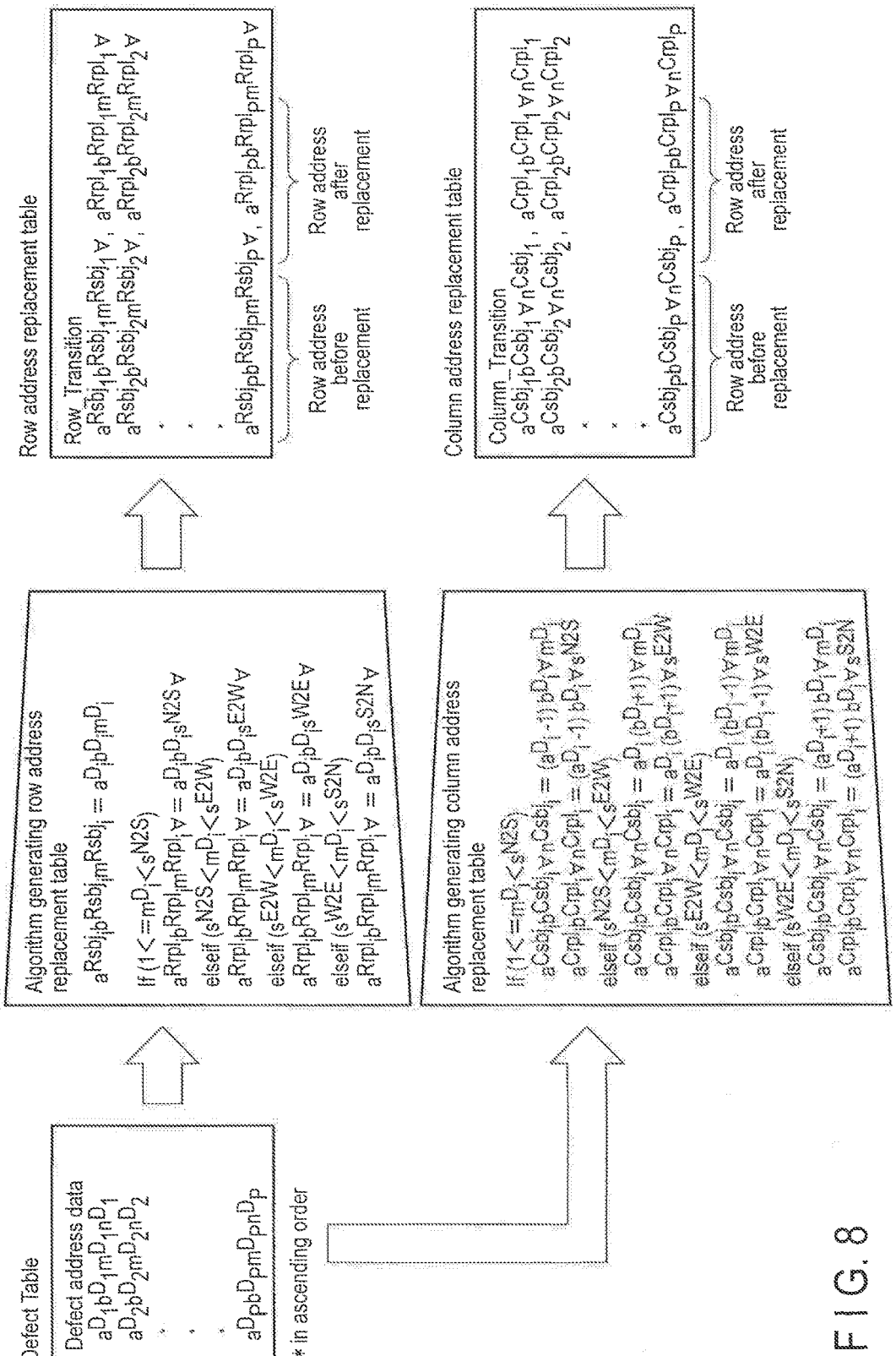
FIG. 8 is a view illustrating an exemplary algorithm which creates an address replacement table.

FIG. 8 illustrates an algorithm which creates an address replacement table from the list of addresses of defects and the interconnection information on crossbars.

The number of elements included in the list of addresses of defects (defect table) is P, and the elements are arranged in a bit ascending order. Let us suppose here that the interconnection of the crossbars, which is illustrated in FIG. 2, is used.

One spare row conductive line is provided for every row conductive line group connected to four adjacent crossbars, North, East, West, and South, and the spare row conductive line has the largest address number in each conductive line group. Moreover, the row addresses are indicated by $s^{N2S}$, $s^{E2W}$, $s^{W2E}$, and $s^{S2N}$. In the embodiment of FIG. 2, $s^{N2S}=3$, $s^{E2W}=6$, $s^{W2E}=9$, and $s^{S2N}=12$ may stand.

In the present embodiment, a row conductive line and a column conductive line which are mutually connected through an input inverter and an output inverter respectively have a local row address and a local column address which should be in agreement with each other. Therefore, a spare column conductive line will be as follows. There is a spare column for every column conductive line group connected from four adjacent crossbars, South, West, East, and North. The spare column has an address which is the largest in address number within each conductive line group. Moreover, the local column addresses may be denoted by $s^{N2S}$, $s^{E2W}$, $s^{W2E}$, and $s^{S2N}$. In the embodiment of FIG. 2, $s^{N2S}=3$, $s^{E2W}=6$, $s^{W2E}=9$, and $s^{S2N}=12$ may stand.

A row address replacement table will be a list of combinations, each being a combination of a row address before replacement or a row address to be subjected to replacement $a^{Rsbj} b^{Rsbj} m^{Rsbj} \forall$ and a row address after replacement or a row address having been subjected to replacement $a^{Rrpl} b^{Rrpl} m^{Rrpl} \forall$.

A column address replacement table will be a list of combinations, each being a combination of a column address before replacement or a column address to be subjected to replacement $a^{Csbj} b^{Csbj} \forall n^{Csbj}$ and a column address after replacement or a column address having been subjected to replacement $a^{Crpl} b^{Crpl} \forall n^{Crpl}$.

What follows is an algorithm for creating a row address replacement table.

A row address before replacement ($a^{Rsbj} b^{Rsbj} m^{Rsbj} \forall$) which is related to an $i^{th}$ defect ($a^D_i b^D_i m^D_i n^D_i$) constitutes the address ($a^D_i b^D_i m^D_i \forall$) of a row in which the $i^{th}$ defect exists.

The row address after replacement ($a^{Rrpl} b^{Rrpl} m^{Rrpl} \forall$) which is made to be related to the $i^{th}$ defect ($a^D_i b^D_i m^D_i n^D_i$) is used for determining that the row in which the $i^{th}$ defect exists belongs to which one of the row conductive line groups, each row conductive line group connected to any one of the four adjacent crossbars, North, East, West, and South, and constitutes the address of a spare row conductive line ($a^D_i b^D_i s^{OUT2IN} \forall$) provided for a group of row conductive lines to which the row conductive line in question belongs. Here, $s^{OUT2IN}$ indicates any one of $s^{N2S}$, $s^{E2W}$, $s^{W2E}$, and $s^{S2N}$.

What follows is an algorithm for creating a column address replacement table.

The column address before replacement ($a^{Csbj} b^{Csbj} \forall n^{Csbj}$) which is related to the $i^{th}$ defect ($a^D_i b^D_i m^D_i n^D_i$) constitutes the address ($a^D_i b^D_i \forall m^D_i$) of a column to which the row in which the $i^{th}$ defect exists is connected through an input and an output inverter. Here, $a^D_i$ and $b^D_i$ respectively indicate an address of a row of a block to which the row in which the $i^{th}$ defect exists is connected through a set of an input and an output inverter and an address of a column to which the row in which the $i^{th}$ defect exists is connected through another set of an input and an output inverter.

The column address after replacement $a^{Crpl} b^{Crpl} \forall n^{Crpl}$ which is related to the $i^{th}$ defect ($a^D_i b^D_i m^D_i n^D_i$) is used for determining that the column conductive line to which the row conductive line in which the $i^{th}$ defect exists is connected through a set of an input and an output inverter is connected to which one of the column conductive line groups, each group being connected to any one of four adjacent crossbars, South, West, East, and North, and the column address after replacement $a^{Crpl}_i b^{Crpl}_i \forall n^{Crpl}$ constitutes a spare column address $(a^D_i b^D_i \forall s^{OUT2IN})$ for the column conductive line in question.

The interconnected relation of crossbars in the above embodiment will simplify an algorithm for creating an address replacement table as illustrated in FIG. 8. The interconnection-related feature of the crossbars of the present embodiment may be summarized as follows.

(1) A row conductive line and a column conductive line, which are mutually connected through a set of an input inverter and an output inverter, respectively have a local row address and a local column address which are in agreement with each other.

(2) One spare row conductive line is provided for every group of row conductive lines, each row conductive line of every group being connected to any one of four adjacent crossbars, North, East, West, and South. Let an address with the largest address number be a row address of a spare row conductive line within each group of the row conductive lines.

(3) There is one spare column conductive line for every group of column conductive lines, each column conductive line of every group being connected to any one of four adjacent crossbars, South, West, East, and North. Let an address with the largest address number be a column address of a spare column conductive line within each group of the column conductive lines.

In the present embodiment, the pre-replacement row addresses in a row address replacement table will be arranged in a bit ascending order if the defect table is in a bit ascending order.

After a column address replacement table is created, it is subjected to a sorting process in order to arrange pre-replacement column addresses in a bit ascending order.

Figure 9:
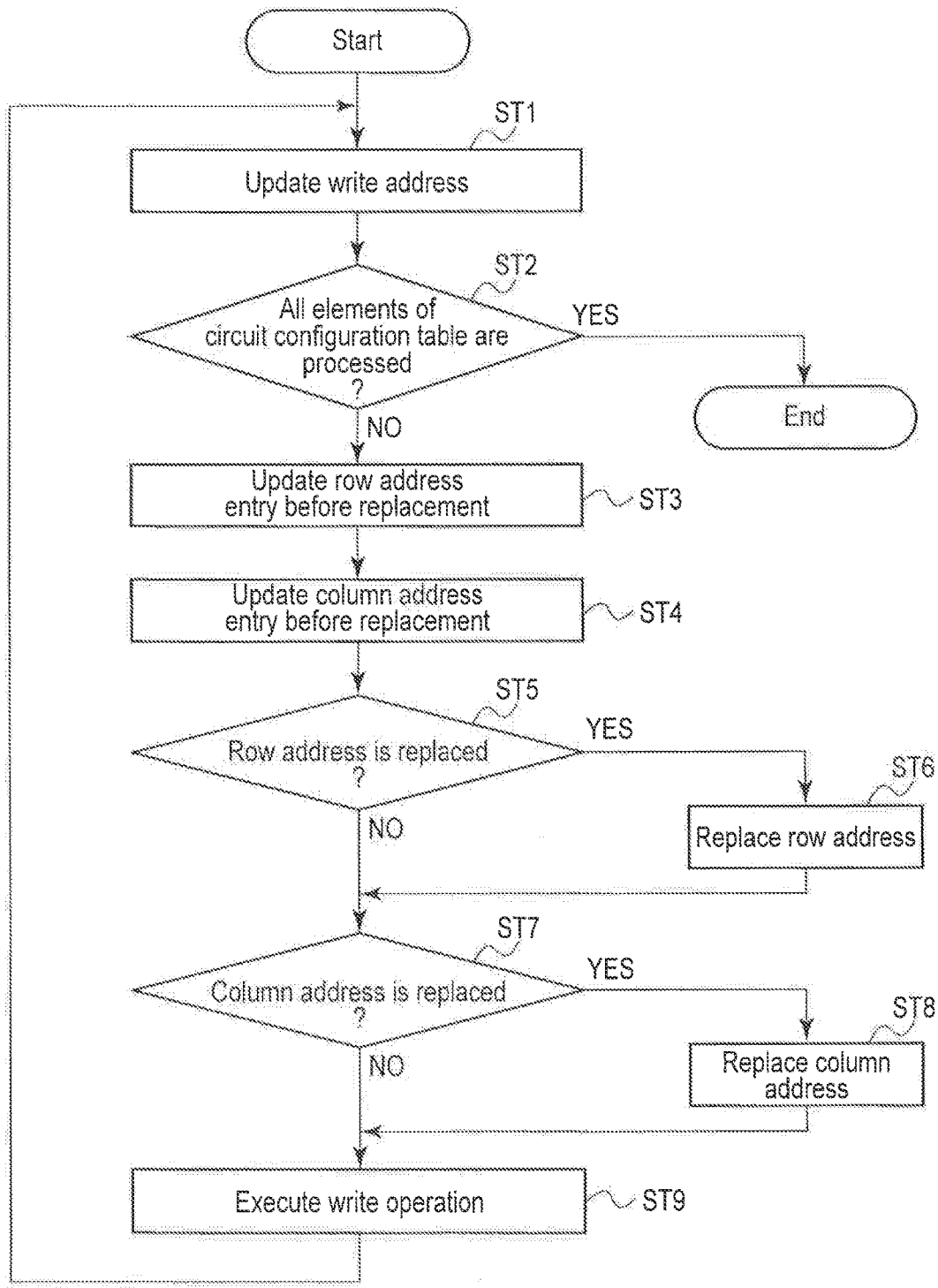
FIG. 9 is a flowchart illustrating a writing algorithm for avoiding a defective cell.

FIG. 9 illustrates writing algorithms which will avoid any defect.

Here, a pre-replacement row/column address entry means a set of addresses which requires comparison in order to determine whether a write address is an address to be replaced.

ST1: Renewal of write addresses

ST2: Every one element of a circuit configuration data table is taken out as a write address $(a^W_i b^W_i m^W_i n^W_i)$. It will end, if all the write addresses are processed.

ST3: Renewal of pre-replacement row address entries

In the present embodiment, one row address which is larger in address value than a write address should be held as a pre-replacement row address entry. When a write address is larger than the pre-replacement row address entry at this point in time, the next element of a row address replacement table is registered as a pre-replacement row address entry. This procedure is repeated until a pre-replacement row address entry will be greater than or equal to a write address.

ST4: Renewal of pre-replacement column address entries

In the present embodiment, a maximum of four column addresses, each being equal to the block address $(a^W_i b^W_i)$ of a write address, should be held as pre-replacement column address entries. When the block address of a write address is larger than the block address of a pre-replacement column address at this point in time, the next element of a column address replacement table (all the elements which are equal in block address to the pre-replacement column address) is registered as a pre-replacement column address entry. This procedure is repeated until the block address of a pre-replacement column address entry becomes greater than or equal to the block address of a write address.

ST5&ST6: Row address replacement determination and replacement

A write address $(a^W_i b^W_i m^W_i n^W_i)$ is compared with a pre-replacement row address entry $(a^{Rsbj} b^{Rsbj} m^{Rsbj} \forall)$. When the addresses coincide with each other, a local row address will be replaced. The write address after replacement will be $a^W_i b^W_i m^{Rrpl} n^W_i$. Here, the local column address $(n^W_i)$ of the write address does not change.

ST7&ST8: Column address replacement determination and replacement

A write address $(a^W_i b^W_i m^W_i n^W_i)$ is compared with a pre-replacement column address entry $(a^{Csbj}_j b^{Csbj}_j \forall n^{Csbj}_j)$. Here, when the row address replacement has been already executed at ST5, the post-replacement write address will be indicated as $(a^W_i b^W_i m^W_i n^W_i)$. When the addresses coincide with each other, a local column address will be replaced. The write address after replacement will be $a^W_i b^W_i m^W_i n^{Crpl}$. Here, the local row address $(m^W_i)$ of the write address does not change. When there are two or more pre-replacement column address entries, the process of replacement determination and replacement will be carried out for all the entries.

ST9: Writing

A write operation is carried out according to a write address. The process returns to ST1.

The present embodiment makes it possible to avoid any defect with a simple algorithm, as illustrated in FIG. 9. The writing algorithm of the present embodiment which can avoid any defect has the following features.

(1) An address replacement table is created first.

(2) A circuit configuration data table has entries arranged in a bit ascending order.

(3) A row address replacement table and a column address replacement table have pre-replacement addresses arranged in a bit ascending order.

Since what are required are a maximum of one pre-replacement row address entry and a maximum of four pre-replacement column address entries, as has been already stated, there may be few hardware resources for implementing them. Therefore, an address replacement portion will be achievable with few hardware resources, i.e., a small area overhead.

2. Exemplary Application

Now, an exemplary application of the above-mentioned embodiment will be explained.

FIG. 10 illustrates an exemplary PLD having an address replacement portion.

Drivers (HL_control, VL_control) 1 and 2 and an address replacement portion 3 respectively correspond to the drivers (HL_control, VL_control) 1 and 2 and the address replacement portion 3 of FIG. 1. Each of programmable computational units 11, 12, 21, and 22 corresponds to the programmable computational unit 11 of FIG. 1.

A storage portion 4 stores address replacement tables.

For example, a row address replacement table and a column address replacement table, such as illustrated in FIG. 8, are stored in the storage portion 4. Any nonvolatile memory, including an electronic fuse (e-fuse), a one-time-programmable memory (OTP) and an embedded NOR flash memory, may be used as the storage portion 4.

The address replacement portion 3 has a logic circuit which performs address replacement with referring to an address replacement table in accordance to an algorithm such as illustrated in FIG. 9, for example.

In the present example, circuit configuration data (bitstream data) may be input from the outside of a PLD 5, for example, from a user computer 6.

Moreover, in the present embodiment, the address replacement portion 3 is arranged inside the PLD 5. In such a case, a user can prepare or update bitstream data without consideration given to any defect information. Moreover, a PLD manufacturer does not need to disclose any defect information to users.

FIG. 11 illustrates an exemplary system of a PLD and a user computer having an address replacement portion.

This example is different from the example illustrated in FIG. 10 in that a user computer 6 has an address replacement portion 3 and a storage portion 4. The rest elements are the same as those illustrated in FIG. 10. Therefore, they are given the same symbols as illustrated in FIG. 10 and their detailed explanation will be omitted.

This configuration makes it possible to eliminate from the PLD 5 a storage portion and an address replacement portion for storing address replacement tables. As a result, the PLD 5 will be simple in circuit configuration and small in chip size.

FIG. 12 illustrates an exemplary application of a PLD which includes a program control circuit and a programmable crossbar comprising three-terminal selectors.

In this example, programmable computational units 11, 12, 21, and 22 each have a 2×2 matrix and individually include a programmable crossbar. Each programmable crossbar includes a 4×4 array of resistance change elements. The programmable crossbar 11 includes four row conductive lines (horizontally extending lines) HL111, HL112, HL113, and HL114 and four column conductive lines (perpendicularly extending lines) VL111, VL112, VL113, and VL114. Two-terminal resistance change elements are arranged at respective regions where the row conductive lines and the column conductive lines cross.

A program control circuit comprises a row driver HL_Control, global row conductive lines GHLij, a column driver VL_Control, and global column conductive lines GVLij. It should be noted that i is 1 or 2, and that j is one of 1, 2, 3, and 4. The program control circuit is shared by the programmable computational units 11, 12, 21, and 22.

For example, the programmable crossbar 11 and the programmable crossbar 12 are connected in common to four global row conductive lines GHL11, GHL12, GHL13, and GHL14. Moreover, the programmable crossbar 11 and the programmable crossbar 21 are connected in common to four global column conductive lines GVL11, GVL12, GVL13, and GVL14.

The global row conductive lines collected into each group and two or more row conductive lines in each programmable crossbar are mutually connected through three-terminal selectors. Similarly, the global column conductive lines collected into each group and two or more column conductive lines in each programmable crossbar are mutually connected through three-terminal selectors. A three-terminal selector may be an FET, for example.

In this example, four global row conductive lines GHL11, GHL12, GHL13, and GHL14 are respectively connected through three-terminal selectors HS111, HS112, HS113, and HS114 to four row conductive lines HL112, HL113, and HL114 in the programmable crossbar 11. Moreover, four global row conductive lines GHL11, GHL12, GHL13, and GHL14 are respectively connected through three-terminal selectors HS121, HS122, HS123, and HS124 to four row conductive lines HL121, HL122, HL123, and HL124 in the programmable crossbar 12.

Similarly, four global column conductive lines GVL11, GVL12, GVL13, and GVL14 are respectively connected through three-terminal selectors VS111, VS112, VS113, and VS114 to four column conductive lines VL111, VL112, VL113, and VL114 in the programmable crossbar 11. Moreover, four global column conductive lines GVL11, GVL12, GVL13, and GVL14 are respectively connected through three-terminal selectors VS211, VS212, VS213, and VS214 to four column conductive lines VL211, VL212, VL213, and VL214 in the programmable crossbar 21.

As has been explained in the above-mentioned embodiment, a programmable crossbar in one certain programmable computational unit is not only connected to programmable logic resources in the computational unit but also to programmable crossbars etc. in other different programmable computational units.

Furthermore, a three-terminal selector in the present embodiment may be replaced with a two-terminal selector, for example, a diode, a nonlinear resistance element, a threshold switch element, etc.

3. Conclusion

As have been mentioned above, the embodiments make it possible to provide a defective tolerance technology which requires few area overheads.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reconfigurable circuit comprising:
  circuit blocks arranged with a matrix of A rows and B columns, each of the circuit blocks comprising:
  M row conductive lines;
  N column conductive lines crossing the row conductive lines;
  output inverters each having input and output terminals, the input terminal of each output inverter connected to corresponding one of the row conductive lines;
  input inverters each having input and output terminals, the output terminal of each input inverter connected to corresponding one of the column conductive lines; and
  resistance change elements between the row conductive lines and the column conductive lines, each of the resistance change elements including a first terminal and a second terminal, the first terminal being connected to corresponding one of the row conductive lines, the second terminal being connected to corresponding one of the column conductive lines, the resistance change element between the $m^{th}$-row conductive line and the $n^{th}$-column conductive line in the circuit block located at the $a^{th}$-row and the $b^{th}$-column being selected by an address abmn ($1 \leq a \leq A$, $1 \leq b \leq B$, $1 \leq m \leq M$, $1 \leq n \leq N$);

the reconfigurable circuit further comprising:
an interconnection connected between the output terminal of the output inverter connected to the row conductive line in one of the circuit blocks and the input terminal of the input inverter connected to the column conductive line in the other one of the circuit blocks; and
a row address replacement circuit for replacing address $a^D b^D m^D \forall$ ($1 \le a^D \le A$, $1 \le b^D \le B$, $1 \le m^D \le M$) with address $a^D b^D m^S \forall$ ($1 \le m^S \le M$) and a column address replacement circuit for replacing address $a^O b^O \forall q^D$ ($1 \le a^O \le A$, $1 \le b^O \le B$, $1 \le q^D \le N$) with address $a^O b^O \forall n^S$ ($1 \le n^S \le N$), wherein $\forall$ stands for an arbitrary number, on condition that the resistance change element selected by address $a^D b^D m^D n^D$ is defective, that the output terminal of the output inverter connected to the $m^{Dth}$-row conductive line in the circuit block located at the $a^{Dth}$-row and the $b^{Dth}$-column is connected to the input terminal of the input inverter connected to the $q^{Dth}$-column conductive line in the circuit block located at the $a^{Oth}$-row and the $b^{Oth}$-column, and that the output terminal of the output inverter connected to the $m^{Sth}$-row conductive line in the circuit block located at the $a^{Dth}$-row and the $b^{Dth}$-column is connected to the input terminal of the input inverter connected to the $n^{Sth}$-column conductive line in the circuit block located at the $a^{Oth}$-row and the $b^{Oth}$-column.

2. The circuit of claim 1, further comprising:
a first table including pre-replacement row addresses in combination with post-replacement row addresses and a second table including pre-replacement column addresses in combination with post-replacement column addresses, the first and second tables being generated based on a list comprising addresses $a^D_i b^D_i m^D_i n^D_i$ of P defective elements ($1 \le i \le P$) and information on interconnection between the circuit blocks.

3. The circuit of claim 2, wherein
the address has a concatenation of bit strings indicating a row address a and a column address b of the circuit block, and a row address m and a column address n of the element in the circuit block, and
the first and second tables each have a pre-replacement address list arranged in a bit ascending order.

4. The circuit of claim 2, further comprising:
a third table including a list comprising addresses of resistance change elements to be changed in a low-resistance state, the addresses in the list being arranged in a bit ascending order.

5. The circuit of claim 4, further comprising:
an address replacement circuit for replacing an address included in the third table based on the first and second tables.

6. The circuit of claim 5, further comprising:
a nonvolatile memory storing information on the first and second tables.

7. The circuit of claim 1, further comprising:
a programmable logical circuit having input terminals and an output terminal, each of the input terminals connected to corresponding one of the output terminals of the output inverters connected to the row conductive lines, and the output terminal connected to corresponding one of the input terminals of the input inverters connected to the column conductive lines.

8. The circuit of claim 1, further comprising:
row program conductive lines;
column program conductive lines;
a row program control circuit controlling a voltage applied to each of the row program conductive lines;
a column program control circuit controlling a voltage applied to each of the column program conductive lines; and
selection elements between the row conductive lines and the row program conductive lines or between the column conductive lines and the column program conductive lines.

9. The circuit of claim 1, wherein
each of the resistance change elements is switchable between a first resistance state and a second resistance state by a voltage applied between the row conductive lines and the column conductive lines.

10. The circuit of claim 1, wherein
each of the circuit blocks includes a programmable logic circuit having input terminals and an output terminal, the input terminals being connected to the row conductive lines, and the output terminal being connected to one of the column conductive lines.

11. A reconfigurable circuit comprising:
circuit blocks arranged with a matrix of A rows and B columns, each of the circuit blocks comprising:
M row conductive lines;
N column conductive lines crossing the row conductive lines;
output inverters each having input and output terminals, the input terminal of each output inverter connected to corresponding one of the row conductive lines;
input inverters each having input and output terminals, the output terminal of each input inverter connected to corresponding one of the column conductive lines; and
resistance change elements between the row conductive lines and the column conductive lines, each of the resistance change elements including a first terminal and a second terminal, the first terminal being connected to corresponding one of the row conductive lines, the second terminal being connected to corresponding one of the column conductive lines, the resistance change element between the $m^{th}$-row conductive line and the $n^{th}$-column conductive line in the circuit block located at the $a^{th}$-row and the $b^{th}$-column being selected by an address abmn ($1 \le a \le A$, $1 \le b \le B$, $1 \le m \le M$, $1 \le n \le N$);
the reconfigurable circuit further comprising:
an interconnection connected between the output terminal of the output inverter connected to the $k^{th}$-row conductive line (k is an arbitrary number) in one of the circuit blocks and the input terminal of the input inverter connected to the $k^{th}$-column conductive line in the other one of the circuit blocks; and
a row address replacement circuit for replacing address $a^D b^D m^D \forall$ ($1 \le a^D \le A$, $1 \le b^D \le B$, $1 \le m^D \le M$) with address $a^D b^D m^S \forall$ ($1 \le m^S \le M$) and a column address replacement circuit for replacing address $a^O b^O \forall m^D$ ($1 \le a^O \le A$, $1 \le b^O \le B$) with address $a^O b^O \forall m^S$, wherein $\forall$ stands for an arbitrary number, on condition that the resistance change element selected by address $a^D b^D m^D n^D$ is defective, and that the circuit block connected to the output terminals of the output inverters of the $m^{Dth}$-row and the $m^{Sth}$-row in the circuit block located at the $a^{Dth}$-row and a $b^{Dth}$-column has the address of the $a^{Oth}$-row and the $b^{Oth}$-column.

12. The circuit of claim 11, further comprising:
a first table including pre-replacement row addresses in combination with post-replacement row addresses and a second table including pre-replacement column addresses in combination with post-replacement column addresses, the first and second tables being generated based on a list comprising addresses $a^D_i b^D_i m^D_i n^D_i$ of P defective elements ($1 \leq i \leq P$) and information on interconnection between the circuit blocks.

13. The circuit of claim 12, wherein
the address has a concatenation of bit strings indicating a row address a and a column address b of the circuit block, and a row address m and a column address n of the element in the circuit block, and
the first and second tables each have a pre-replacement address list arranged in a bit ascending order.

14. The circuit of claim 12, further comprising:
a third table including a list comprising addresses of resistance change elements to be changed in a low-resistance state, the addresses in the list being arranged in a bit ascending order.

15. The circuit of claim 14, further comprising;
an address replacement circuit for replacing an address included in the third table based on the first and second tables.

16. The circuit of claim 15, further comprising:
a nonvolatile memory storing information on the first and second tables.

17. The circuit of claim 11, further comprising:
a programmable logical circuit having input terminals and an output terminal, each of the input terminals connected to corresponding one of the output terminals of the output inverters connected to the row conductive lines, and the output terminal connected to corresponding one of the input terminals of the input inverters connected to the column conductive lines.

18. The circuit of claim 11; further comprising:
row program conductive lines;
column program conductive lines;
a row program control circuit controlling a voltage applied to each of the row program conductive lines;
a column program control circuit controlling a voltage applied to each of the column program conductive lines; and
selection elements between the row conductive lines and the row program conductive lines or between the column conductive lines and the column program conductive lines.

19. The circuit of claim 11, wherein
each of the resistance change elements is switchable between a first resistance state and a second resistance state by a voltage applied between the row conductive lines and the column conductive lines.

20. The circuit of claim 11, wherein
each of the circuit blocks includes a programmable logic circuit having input terminals and an output terminal, the input terminals being connected to the row conductive lines, and the output terminal being connected to one of the column conductive lines.

* * * * *